United States Patent [19]

Ara et al.

[11] Patent Number: 5,027,354
[45] Date of Patent: Jun. 25, 1991

[54] ELECTRONIC MEMORY TESTING DEVICE

[75] Inventors: Mitsuyuki Ara; Yoshihiro Honma, both of Tokyo, Japan

[73] Assignee: Ando Electric Co., Ltd., Tokyo, Japan

[21] Appl. No.: 433,384

[22] Filed: Nov. 6, 1989

[30] Foreign Application Priority Data

Mar. 27, 1987 [JP] Japan ................................ 62-73778

[51] Int. Cl.⁵ ........................................ G01R 31/28
[52] U.S. Cl. .................................. 371/25.1; 371/212
[58] Field of Search ...................... 324/73 R, 73 AT; 371/25, 21, 24, 67, 68, 25.1, 21.2

[56] References Cited

U.S. PATENT DOCUMENTS

| | | | |
|---|---|---|---|
| 3,622,876 | 11/1971 | Ure et al. | 324/73 R |
| 4,412,327 | 10/1983 | Fox et al. | 371/21 |
| 4,517,661 | 5/1985 | Graf et al. | 364/900 |
| 4,656,632 | 4/1987 | Jackson | 371/20 |
| 4,696,005 | 9/1987 | Millham et al. | 371/27 |

Primary Examiner—Stephen M. Baker
Attorney, Agent, or Firm—Flynn, Thiel, Boutell & Tanis

[57] ABSTRACT

A verification circuit comprising a CPU, a RAM connected with the CPU and a data A is written therein, an I/O port connected at input thereof an output of said CPU and an output of the RAM for receiving the data A from the RAM, a plurality of drivers each connected with the output of the RAM via said I/O port, the drivers being turned on while a control signal is "1" and turned off while the control signal is "0", a PROM connected with an output of the driver, the data A written in said PROM when the control signal is "1", and a data B to be compared with the data A is read from the PROM when the control signal is "0", a reference voltage having H and L levels, a plurality of analog switches each issuing H level of the reference voltage while the data A is "1" and L level of the reference voltage while the data A is "0", and a plurality of comparators each having one input terminal connected with an output of the analog switch and the other input terminal connected with the output of the PROM. The verification circuit may further include a plurality of the exclusive OR circuit and a gate.

1 Claim, 3 Drawing Sheets

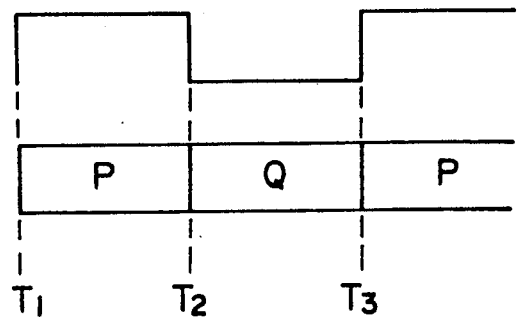
FIG.3(a)
FIG.3(b)
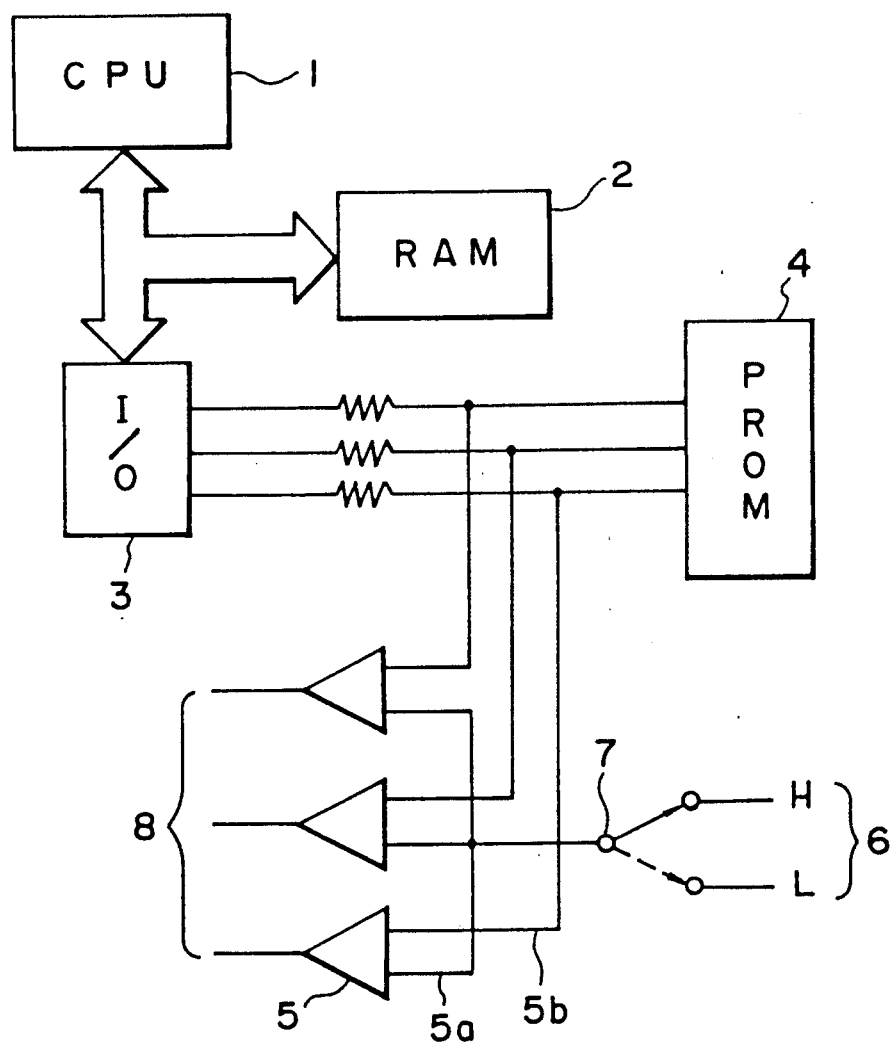
FIG.4 (PRIOR ART)

ELECTRONIC MEMORY TESTING DEVICE

This application is a continuation of U.S. Ser. No. 07/173 996, filed Mar. 28, 1988, abandoned.

BACKGROUND OF THE INVENTION

1. Field of the Invention

The present invention relates to a verification circuit, or comparison and decision circuit for comparing a data written in RAM with a data written in and read from a PROM whereby verification of the data is made.

2. Prior Art

A prior verification circuit is described with reference to FIG. 4.

The verification circuit comprises a CPU 1, a RAM 2 storing a data A composed of 2 bits and connected with an output of the CPU 1, an input of an I/O port 3 connected with the output of the CPU 1 and an output of the RAM 2, a PROM 4 connected with the output of the RAM 2 via the I/O port 3, the data A being written in the PROM 4, a plurality of, comparators 5 input terminals thereof respectively connected with the output of the PROM 4 and outputs of reference voltage 6 having H and L levels (for example the former is set to 2.35 V and the latter to 0.5 V) via a switch 7.

With such an arrangement, the prior verification circuit is operated as follows, reading a data A composed of "1" and "0" stored in the RAM 2 by CPU 1 based on an instruction from the CPU 1, transferring the read data A to the PROM 4 through the I/O port 3, writing the data A in the PROM 4 which is called as the data B, (the data B is same as the data A. To verify the data A is correct or not, it is troublesome to compare the data A with data A. Therefore, for convenience of comparison and verification the data stored in the RAM 2 is called as the data A and the data A written in the PROM 4 is called as the data B), reading the data B composed of "1" and "0" from the PROM 4 by the CPU 1 according to the instruction from the CPU 1, every time the clock pulse is issued and the data A is written in the PROM 4, switching the switch 7 to issue the reference voltage of H level thereof to decide as to whether the data B is "1" or not, switching the switch 7 to issue the reference voltage of L level thereof to decide as to whether the data B is "0" or not, verifying by CPU 1 as to whether the data A is identical with a result of comparison between the data A and the data B.

However, there are the following problems in the prior verification circuit. Firstly, the reference voltage is changed to H or L level every time deciding as to whether the data B is H or L level; secondly, a verification of the data A read from the RAM 2 and the data B read from the PROM 4 is made by the CPU 1. As result, there occurred a problem that the time to verify the data A can not be reduced.

SUMMARY OF THE INVENTION

It is therefore an object of the present invention to provide a verification circuit to shorten the time to verify a data A in the manner that H and L level of a reference voltage are automatically changed by the data A composed of "1" and "0", and furthermore the data A read from a RAM 2 and a data B read from a PROM 4 are compared with each other by means of hardware, and a signal is issued only when the data A and the data B are different from each other and the issued signal is delivered to a CPU 1, based on the issued signal, the false of the data A is instantly verified.

The above and other objects, features and advantages of the present invention will become more apparent from the following description taken in conjunction with the accompanying drawings.

BRIEF DESCRIPTION OF THE DRAWINGS

FIG. 3 is a waveform of control signals, represented at P and Q showing instructions of CPU; and FIG. 4 is a prior verification circuit.

PREFERRED EMBODIMENT OF THE PRESENT INVENTION

Figure 1:
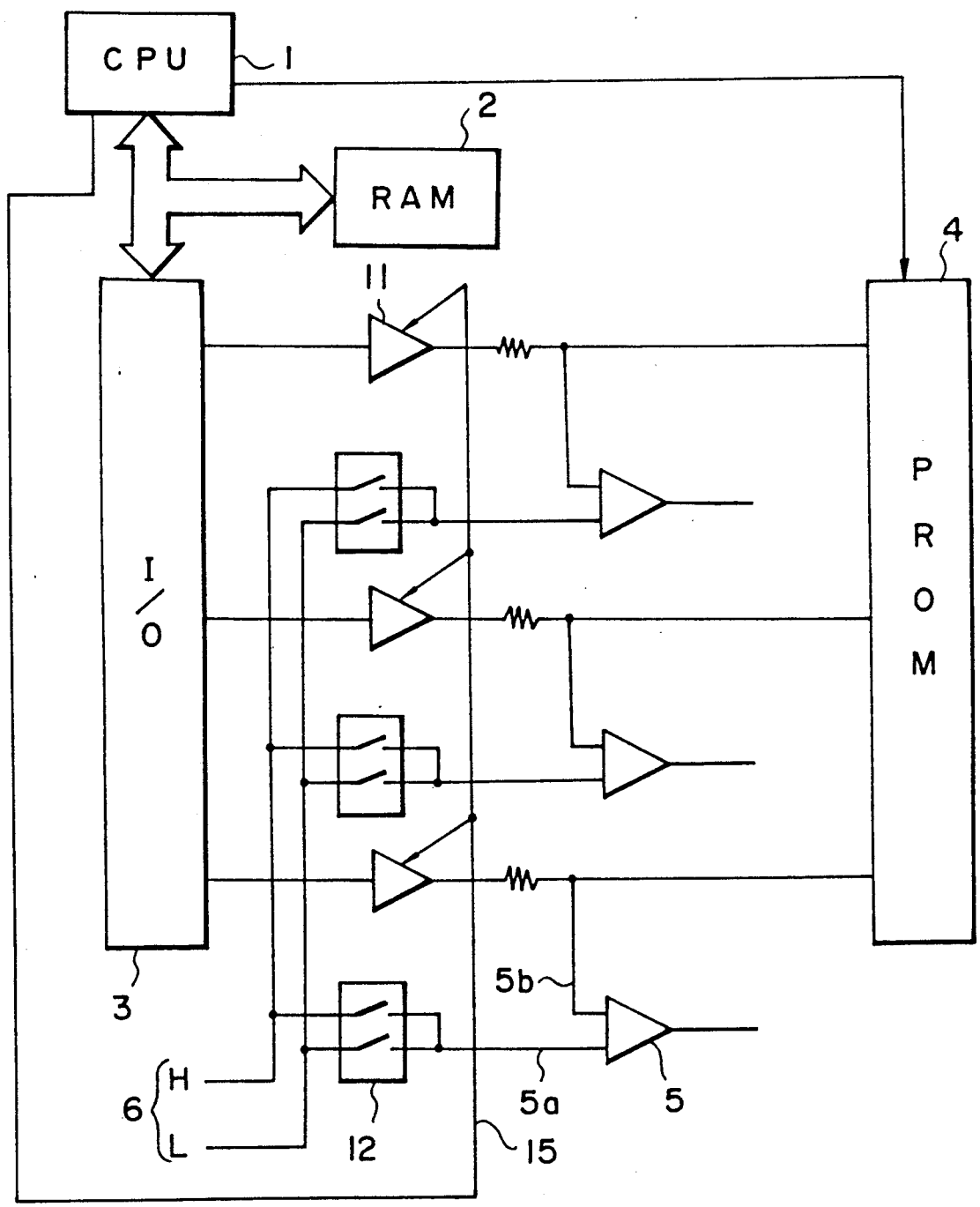
FIG. 1 is a verification circuit according to a first embodiment of the present invention.

A verification circuit according to a preferred embodiment of the present invention will be described with reference to FIGS. 1 to 3, in which same reference numerals designate same parts throughout the drawings, and the description thereof will be omitted.

The verification circuit comprises a CPU 1, a RAM 2 wherein a plurality of bits of data A composed of "1" and "0" are written, the RAM 2 being connected with an output of the CPU 1, an I/O port 3 connected at the input thereof with the output of the CPU 1 and an output of the RAM 2 for receiving the data A from the RAM 2, a plurality of drivers 11 connected with the output of said RAM 2 via the I/O port 3 at the input thereof and controlled by the CPU 1 via a control line 15 the drivers 11 being turned on while a control signal issued from the CPU 1 is "1" and turned off while the control signal is "0", a PROM 4 connected with outputs of the drivers 11, and the data A is written in the PROM 4 when the control signal is "1", a reference voltage 6 having H and L levels, a plurality of analog switches 12 issuing H level of said reference voltage while the data A is "1" and L level of said - reference voltage 6 while the data A is "0", a plurality of comparators 5 connected at the inputs thereof with outputs of the analog switches 12 and an output of the PROM 4, namely, connected with the data B read from the PROM 4.

An operation of the first embodiment will be described with reference to the control signals issued from the CPU 1.

During a period of T1 to T2 in FIG. 3, a control signal is turned on or "1" to cause the drivers 11 to be turned on, and the data A from the RAM 2 is written in the PROM 4 based on an instruction P from the CPU 1. At this time, the I/O port 3 delivers the data A both to the PROM 4 and the analog switches 12. The analog switches 12 apply H level of the reference voltage 6 to input terminals 5a of the comparators 5 while the associated bit of the data A is "1", and apply L level of the reference voltage 6 to the input terminals 5a of the comparators 5 when the associated bit of the data A is "0". During a period of T2 to T3, a control signal is not issued or "0" to thereby turn off the drivers 11 so that the data B written in the PROM 4 is read according to the instruction Q from the CPU 1. The comparators 5 compare the data A and the data B to decide as to whether they are same or not, if same, the data is verified as true. Since the analog switches 12 are controlled by the data A and the reference voltage 6 corresponding to the data A is applied to the comparator 5, the comparison and verification are instantly made.

SECOND EMBODIMENT

In addition to the components of the first embodiment, a plurality of exclusive OR circuits 13 and a gate 14 are provided according to a second embodiment.

The output from the comparator 5 and the data A from the I/O port 3 are applied to the input terminals of the exclusive OR circuits 13. According to the second embodiment, when an output from the gate 14 is "1", then the data A from the RAM 2 and the data B from the PROM 4 are not identical with each other, which verifies that the data A is false. The drivers 11 are turned on while the control signal is "1" and turned off while the control signal is "0" where the drivers 11 become high impedance. The high impedance is made to prevent the collision of the data A applied to the drivers 11 from the I/O port 3 and the data B applied to the drivers 11 from the PROM 4.

According to the present invention, the analog switches are controlled by the data A, and the reference voltage corresponding to the data A, so that reading and writing of the data A and the data B, are instantly made, namely, the data A and the data B are verified instantly.

Figure 2:
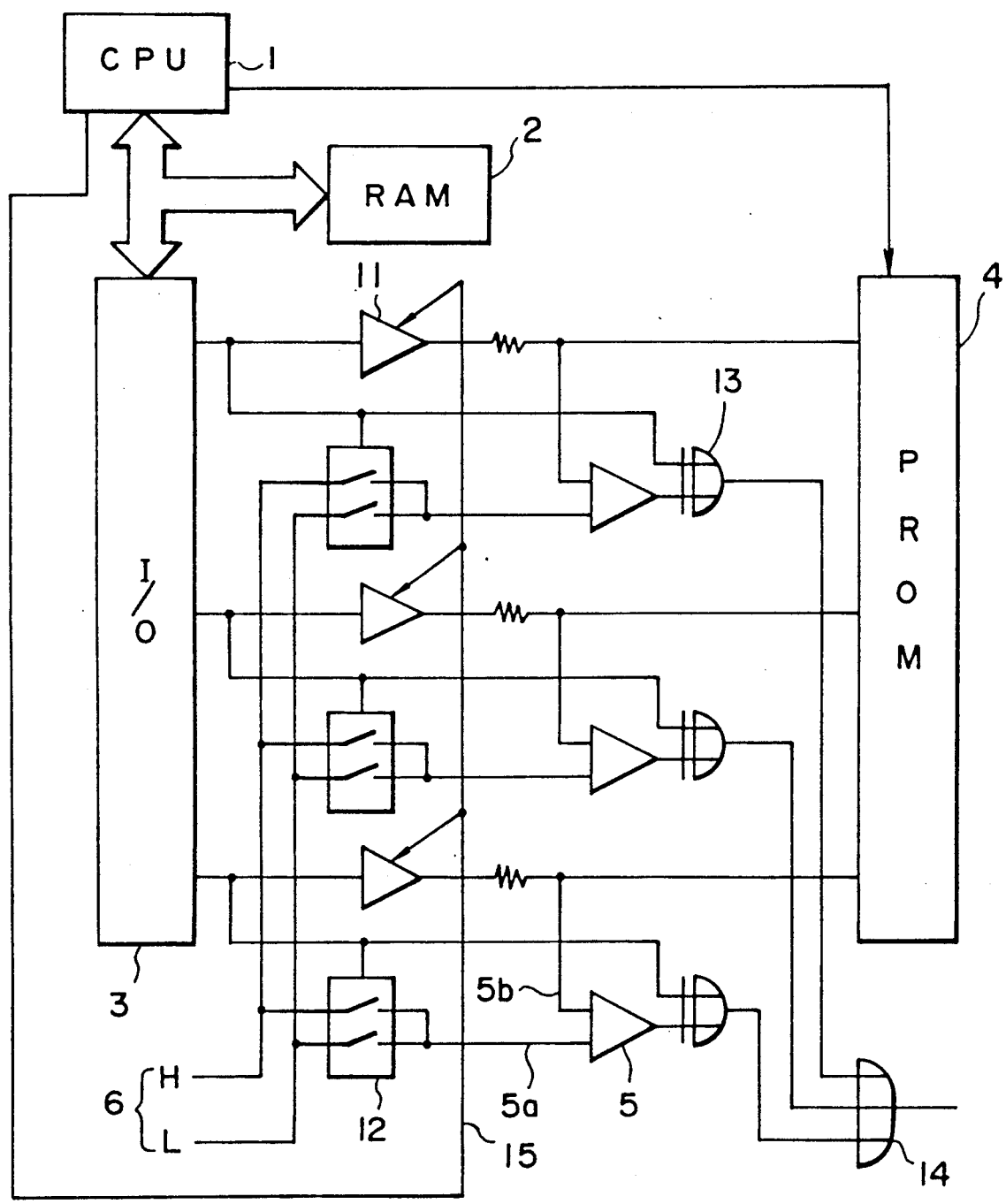
FIG. 2 is a verification circuit according to a second embodiment of the present invention.

For example, it takes 10 minutes to make the comparison and verification according to the circuit of the present invention in FIG. 1 while it takes 50 minutes according to the prior circuit in FIG. 4.

What is claimed is:
1. A verification circuit comprising:
A CPU;
a RAM wherein a data A having a plurality of bits composed of "1" and "0" are written, said RAM being connected with said CPU;
an I/O port having connected at an input thereof an output of said CPU and an output of said RAM for receiving the data A from said RAM;
a plurality of drivers each connected at an input thereof with the output of said RAM via said I/O port, said drivers being turned on while a control signal issued from said CPU is "1" and turned off while the control signal is "0";
a PROM connected with an output of each of said drivers, the data A being written in said PROM when the control signal is "1", and a data B to be compared with the data A being read from said PROM when the control signal is "0";
reference voltages having respective H and L levels;
a plurality of analog switches each having means driven directly by said data A for providing at an output thereof said H level when an associated said bit of the data A is "1" and said L level when an associated said bit of the data A is "0";
a plurality of comparators each having one input terminal connected with a respective said output of said analog switches and an other input terminal connected with an output of said PrOM to receive the data B read from said PROM, a plurality of exclusive OR circuits each having a first input terminal connected with an output of a respective said comparator and second input terminal connected with the output of said RAM to receive the data A via said I/O port, and a gate having input terminals which are each connected with an output of a respective said exclusive OR circuit, said gate being arranged to issue a "1" when the data A from said /RAM and the data B from said PROM are not identical with each other and a "0" when the data A and the data B are identical with each other.

* * * * *

UNITED STATES PATENT AND TRADEMARK OFFICE
CERTIFICATE OF CORRECTION

PATENT NO. : 5,027,354

DATED : June 25, 1991

INVENTOR(S) : Mitsuyuki ARA et al

It is certified that error appears in the above-identified patent and that said Letters Patent is hereby corrected as shown below:

Column 4, line 25; replace "an other" with ---another---.

line 26; replace "PrOM" with ---PROM---.

line 30; after "and" insert ---a---.

line 36; replace "/RAM" with ---RAM---.

Signed and Sealed this

Sixth Day of October, 1992

Attest:

DOUGLAS B. COMER

*Attesting Officer*     Acting Commissioner of Patents and Trademarks